United States Patent [19]

Poetzinger

[11] Patent Number: 5,724,230
[45] Date of Patent: Mar. 3, 1998

[54] FLEXIBLE LAMINATE MODULE INCLUDING SPACERS EMBEDDED IN AN ADHESIVE

[75] Inventor: Steven Eugene Poetzinger, Apex, N.C.

[73] Assignee: International Business Machines Corporation, Armonk, N.Y.

[21] Appl. No.: 669,900

[22] Filed: Jun. 21, 1996

[51] Int. Cl.$^6$ .............................. H05K 5/03; H05K 5/04; H05K 7/20; H01L 23/34
[52] U.S. Cl. .................. 361/758; 257/712; 257/713; 257/709; 361/704; 361/714; 361/715
[58] Field of Search ........................... 174/252, 254; 228/180.21, 180.22; 257/668, 675, 678, 688, 704, 707, 709, 712, 713, 719, 723, 738, 796; 361/688, 704, 707, 712, 714, 715, 717, 718, 719, 720, 722, 749, 752, 753, 758, 761, 764; 437/221, 224

[56] References Cited

U.S. PATENT DOCUMENTS

| | | | |
|---|---|---|---|
| 5,239,448 | 8/1993 | Perkins et al. | 361/764 |
| 5,397,921 | 3/1995 | Karnezos | 257/779 |
| 5,404,273 | 4/1995 | Akagawa | 361/707 |
| 5,409,865 | 4/1995 | Karnezos | 437/210 |
| 5,625,228 | 4/1997 | Rogren | 361/707 |

OTHER PUBLICATIONS

"Has the Packaging Revolution Finally Run Out of Steam?," Iscoff, Ron, *Semiconductor International*, Feb. 1995, pp. 67–72.
"Shinko Electric Commits to 'Skimpy' IC–Package Revolution," *Semiconductor International*, Sep. 1995, p. 17.
U.S. Patent Application Serial No. 08/507,719 filed Jul. 26, 1995 (EN9-93-051X).

*Primary Examiner*—Donald Sparks
*Attorney, Agent, or Firm*—Michele A. Mobley; Jenkens & Gilchrist

[57] ABSTRACT

An electronic module is provided including a chip bonded to a flexible laminate, and an apparatus for establishing coplanarity of a surface of the module, the apparatus comprising (1) a stiffener having a recessed portion for receiving the chip mounted to the flexible laminate, the recessed portion including a first planar surface and a second planar surface with the two planar surfaces being substantially parallel to each other, and (2) an adhesive bond line along the second planar surface for attaching the flexible laminate to the stiffener, the adhesive bond line including a plurality of spacers embedded within the adhesive bond line.

4 Claims, 1 Drawing Sheet

FLEXIBLE LAMINATE MODULE INCLUDING SPACERS EMBEDDED IN AN ADHESIVE

TECHNICAL FIELD OF THE INVENTION

The invention relates to electronic modules. More particularly, the invention relates to the use of spacers, typically in the shape of a sphere, embedded in the adhesive that bonds a stiffener to a laminate, thereby controlling the coplanarity of the electronic modules.

BACKGROUND OF THE INVENTION

Mechanical coplanarity is a requirement for the bottom surface of electronic modules. The use of flexible laminate within the electronic module makes it difficult to maintain coplanarity of the bottom side of the module, particularly if the bondline between the flexible laminate and a stiffener varies in thickness. Moreover, the flexible laminate may curl. These problems are particularly pronounced if the adhesive used as in the electronic module is not applied in sheet form, but as a paste, or is applied with a thick bondline.

The resulting module coplanarity may vary up to the thickness of the stiffener-to-laminate bondline thickness, which in turn causes assembly problems since mechanical coplanarity of the electronic module has not been achieved.

The use of spherical shaped balls in electronic modules is well-known in the art. With the increase in the number of input/output leads extending from electronic devices, such as integrated circuits, ball grid array (BGA) packages have been developed. A BGA package is a type of packaged electronic device in which at least one electronic device, such as an integrated circuit chip, is mounted to a substrate and an electrical connection to an electrically conductive material not part of the packaged electronic device, such as a printed circuit board (PCB), is made by an array of solder balls located on a surface of the substrate.

It is known in the art that spacers, usually in the form of small balls (i.e., spherical in shape), may be embedded in the adhesive used to connect a chip to a stiffener. The spacers thus mechanically "seat" the stiffener with respect to the chip. The bondline thus is set mechanically, i.e., is determined by the size of the spacers, and does not vary.

The use of spacers in other areas of the electronic module, is not known in the art.

SUMMARY OF THE INVENTION

The present invention provides a means for achieving mechanical coplanarity within an electronic module by the use of spacers at key bondlines in the electric module.

Accordingly, an electronic module is provided including a chip bonded to a flexible laminate, and an apparatus for establishing coplanarity of a surface of the module, the apparatus comprising (1) a stiffener having a recessed portion for receiving the chip mounted to the flexible laminate, the recessed portion including a first planar surface and a second planar surface with the two planar surfaces being substantially parallel to each other, and (2) an adhesive bondline along the second planar surface for attaching the flexible laminate to the stiffener, the adhesive bondline including a plurality of spacers embedded within the adhesive bondline.

An advantage of the invention is that by the use of spacers, mechanical coplanarity of the electronic module is achieved.

A further advantage of the invention is that the spacers used to achieve the coplanarity of the electronic module presenting are used for other purposes in electronic modules and thus are readily available and the new use of the spacers in accordance with the present invention should not require many changes in the manufacturing process for electronic modules.

DETAILED DESCRIPTION OF THE INVENTION

Figure 1:
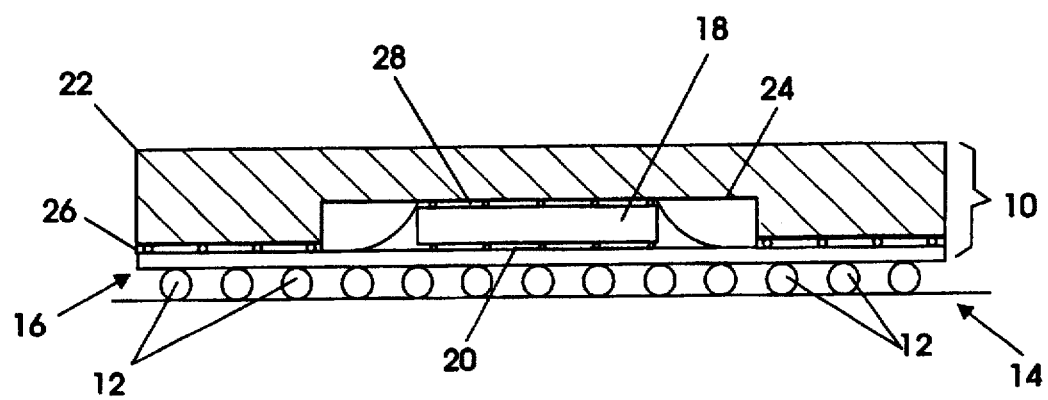
FIG. 1 is a cross-sectional depiction of an electronic module manufactured in accordance with the present invention.

The invention may best be understood by reference to the drawings. FIG. 1 shows a cross-sectional view of an electronic module 10. The electronic module 10 comprises an array of solder balls 12 located on a surface of a base substrate 14. A flexible substrate 16 rests on top of the array of solder balls 12. A chip 18 is mounted on top of the flexible substrate 16. In FIG. 1 the chip 18 is mounted using the "flip chip" mount which is known in the art. The present invention also is applicable to other types of chip mounting, such as the more common cavity down, wire bonded mounted chip module. A layer of adhesive 20 connects the chip 18 to the flexible substrate 16. A stiffener 22 is mounted over the chip 18. The stiffener 22 is connected to the flexible laminate 16 by a layer of adhesive 26. The stiffener 22 has a recessed portion 24 to accommodate the chip 18. The stiffener 22 is connected to the upper plane of the chip 18 by a layer of adhesive 28.

The stiffener 22 serves at least two purposes in addition to providing a means for achieving coplanarity of the electronic module. Namely, the stiffener 22 provides an integral cap over the chip 18 and the stiffener 22 operates as a heat spreader to dissipate the heat generated by the chip 18.

Figure 2:
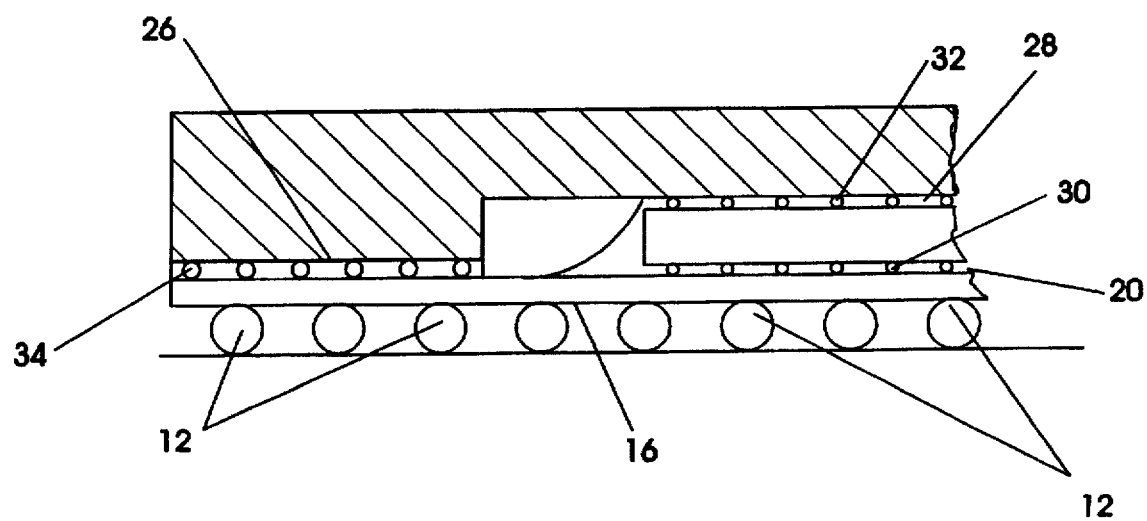
FIG. 2 is an expanded cross-sectional view of a potion of an electronic module manufactured in accordance with the present invention.

FIG. 2 is an expanded view of the electronic module shown in FIG. 1. FIG. 2, in particular, shows the detail of each adhesive layer. From FIG. 2, it can be seen that the adhesive layer 20 that connects the chip 18 to the flexible substrate 16, contains spacers 30. The present invention assumes that the chip 18 is satisfactorily seated on the flexible substrate 16. The use of spacers 30 on this adhesive layer 20 is known in the art. Also from FIG. 2, it is apparent that the adhesive layer 28 between the chip 18 and the stiffener 22 also contains spacers 32. The use of spacers 32 in such an adhesive layer 28 is known in the art.

The present invention is the use of spacers 34 in the adhesive layer 26 between the stiffener 22 and the flexible substrate 16. By using spacers 34 in the adhesive layer 26, also known as a bondline, the coplanarity of the electronic module is mechanically determined. That is, the width of the adhesive layer 34 is known and is constant since the width is determined by the width (or diameter) of the spacers 34. Since coplanarity is achieved at each adhesive layer, namely at adhesive layers 20, 28, and 26, the coplanarity of the entire module 10 is assured at both the plane of the flexible substrate 16 and the plane of the solder balls 12. This in turn assures coplanarity at the base substrate 14.

The size of the spacers 34 are determined by the nominal bondline (i.e., width of adhesive layer 26) less the accumulated mechanical tolerances. By using such an approach to selecting spacers, the sum of the mechanical tolerances, not the bondline thickness, is the only limit on the maximum coplanarity that can be achieved. The use of spacers 34 also permits a minimum width of the adhesive layer 26 even though the substrate 16 is flexible. Moreover, by using spacers 34 within the adhesive layer 26, the chip 18 to stiffener 22 bondline, at adhesive layer 28 is determined solely by the size of the spacers 32. This is true because the stiffener seats on the spacers 32, not on the spacers 34. Thus, spacers 34 do not affect the chip 18 bondline at adhesive layer 28.

The size of spacers 34 to be used in a particular application depend on the desired width of the bondlines 26 and on the mechanical tolerances involved. The spacers 34 may be the same size, or a different size, as the spacers 32 and the spacers 30.

In an alternative embodiment of the invention, the spacers 32 are eliminated entirely, leaving only the spacers 34.

The spacers 34 typically are made of glass. In the preferred embodiment of the invention, the spacers 34 are 0.005 inches in diameter and are made of glass. The spacers typically are round or spherical in shape, but other shapes are possible.

The adhesive layers at 20, 26, and 28, may be comprised of adhesive in the form of tape, a sheet, or a liquid. The adhesive material at adhesive layer 20 is generally an epoxy. Dexter Electronic makes several epoxy encapsulants suitable for use at adhesive layer 20 under the brand name Hysol. Adhesive layers 26 and 28 generally are either in the form of tape or paste. Suitable adhesive for adhesive layers 26 and 28 are Chomeries 400 Series double-sided tape, or GE TC32806 adhesive paste. The adhesive used in the preferred embodiment of the invention is GE TC32806.

Although a specific embodiment and example of its application have been described herein for the purposes of illustration, those skilled in the art will know that various modifications may be made without departing from the spirit or scope of the invention. Accordingly, the scope of the invention is limited only by the following claims and their equivalents.

What is claimed is:

1. An electronic module, including a chip bonded to a flexible laminate, and apparatus for establishing coplanarity of a base surface of the electronic module, the apparatus comprising:

a stiffener having a recessed portion for receiving a chip mounted to the flexible laminate, the recessed portion including an upper planar surface and a lower planar surface, the upper and lower planar surfaces being substantially parallel; and a bond line along the lower planar surface for attaching the flexible laminate to the stiffener, the bond line including a plurality of spacers embedded within adhesive.

2. The electronic module of claim 1, wherein the flexible laminate is a tape substrate.

3. The electronic module of claim 1, wherein the stiffener further provides in integral cap and heat spreader for the chip.

4. The electronic module of claim 1, wherein the spacers are substantially spherically shaped.

* * * * *